United States Patent
Rozploch

(10) Patent No.: US 9,842,868 B2
(45) Date of Patent: Dec. 12, 2017

(54) QUANTUM EFFICIENCY (QE) RESTRICTED INFRARED FOCAL PLANE ARRAYS

(71) Applicant: Sensors Unlimited, Inc., Princeton, NJ (US)

(72) Inventor: Robert Rozploch, Newtown, PA (US)

(73) Assignee: Sensors Unlimited, Inc., Princeton, NJ (US)

( * ) Notice: Subject to any disclaimer, the term of this patent is extended or adjusted under 35 U.S.C. 154(b) by 8 days.

(21) Appl. No.: 15/016,015

(22) Filed: Feb. 4, 2016

(65) Prior Publication Data

US 2017/0117308 A1    Apr. 27, 2017

Related U.S. Application Data

(60) Provisional application No. 62/246,512, filed on Oct. 26, 2015.

(51) Int. Cl.
    *H01L 27/14*    (2006.01)
    *H01L 27/144*   (2006.01)
    (Continued)

(52) U.S. Cl.
    CPC .... *H01L 27/1446* (2013.01); *H01L 27/14649* (2013.01); *H01L 31/02162* (2013.01);
    (Continued)

(58) Field of Classification Search
    CPC .......... H01L 27/1446; H01L 31/02164; H01L 31/109; H01L 27/14; H01L 27/144
    See application file for complete search history.

(56) References Cited

U.S. PATENT DOCUMENTS

| | | | |
|---|---|---|---|
| 7,496,293 B2 | 2/2009 | Shamir et al. | |
| 7,652,765 B1 | 1/2010 | Geshwind et al. | |
| 8,294,100 B2 | 10/2012 | Rafferty et al. | |
| 8,619,143 B2 | 12/2013 | Motta | |
| 9,111,830 B1 * | 8/2015 | Dixon | H01L 27/14625 |
| 9,163,905 B2 | 10/2015 | Ell | |

(Continued)

FOREIGN PATENT DOCUMENTS

| | | |
|---|---|---|
| EP | 2882185 A1 | 6/2015 |
| WO | WO-2004/061127 A2 | 7/2004 |
| WO | WO-2012/123702 A1 | 9/2012 |

OTHER PUBLICATIONS

Extended European Search Report dated Apr. 6, 2017 issued during the prosecution of European Patent Application No. EP 16195743.6 (9 pages).

*Primary Examiner* — Fazli Erdem
(74) *Attorney, Agent, or Firm* — Locke Lord LLP; Scott D. Wofsy; Joshua L. Jones

(57) ABSTRACT

A sensor includes an InGaAs photodetector configured to convert received infrared radiation into electrical signals. A notch filter is operatively connected to the InGaAs photodetector to block detection of wavelengths within at least one predetermined band. An imaging camera system includes an InGaAs photodetector configured to convert received infrared radiation into electrical signals, the InGaAs photodetector including an array of photodetector pixels each configured to convert infrared radiation into electrical signals for imaging. At least one optical element is optically coupled to the InGaAs photodetector to focus an image on the array. A notch filter is operatively connected to the InGaAs photodetector to block detection of wavelengths within at least one predetermined band. A ROIC is operatively connected to the array to condition electrical signals from the array for imaging.

11 Claims, 2 Drawing Sheets

(51) Int. Cl.
   *H01L 31/109*      (2006.01)
   *H01L 31/0216*     (2014.01)
   *H01L 31/0304*     (2006.01)
   *H01L 27/146*      (2006.01)

(52) U.S. Cl.
   CPC .. *H01L 31/02164* (2013.01); *H01L 31/03046* (2013.01); *H01L 31/109* (2013.01)

(56) References Cited

U.S. PATENT DOCUMENTS

| | | | | |
|---|---|---|---|---|
| 9,354,370 | B1* | 5/2016 | Erdogan | G02B 5/285 |
| 2006/0039001 | A1 | 2/2006 | Voigt et al. | |
| 2006/0291849 | A1* | 12/2006 | Shamir | G03B 7/08 396/334 |
| 2011/0228097 | A1* | 9/2011 | Motta | H04N 5/33 348/164 |
| 2012/0123702 | A1 | 5/2012 | Chen et al. | |
| 2013/0023773 | A1* | 1/2013 | Krishna | A61B 5/444 600/474 |
| 2013/0235178 | A1* | 9/2013 | Wang | H04N 5/33 348/77 |
| 2014/0312161 | A1* | 10/2014 | Ell | F41G 7/008 244/3.16 |
| 2015/0090866 | A1* | 4/2015 | Lee | G01S 17/88 250/226 |
| 2015/0156426 | A1* | 6/2015 | Malchow | G02B 5/208 348/164 |
| 2015/0234205 | A1* | 8/2015 | Schowengerdt | G02C 7/049 351/159.02 |
| 2016/0282179 | A1* | 9/2016 | Nazemi | G01S 17/003 |

\* cited by examiner

QUANTUM EFFICIENCY (QE) RESTRICTED INFRARED FOCAL PLANE ARRAYS

CROSS-REFERENCE TO RELATED APPLICATION

This application claims benefit of priority under 35 U.S.C. §119 (e) to U.S. Provisional Application No. 62/246,512, filed Oct. 26, 2015, which is incorporated herein by reference in its entirety.

BACKGROUND OF THE INVENTION

1. Field of the Invention

The present disclosure relates to sensors, and more particularly to infrared sensors such as used in infrared imaging systems and the like.

2. Description of Related Art

InGaAs, or indium gallium arsenide, is an alloy of gallium arsenide and indium arsenide. In a more general sense, it belongs to the InGaAsP quaternary system that consists of alloys of indium arsenide (InAs), gallium arsenide (GaAs), indium phosphide (InP), and gallium phosphide (GaP).

To a large extent, the electrical and optical properties of a semiconductor depend on its energy bandgap and whether the bandgap is "direct" or "indirect." The energy bandgaps of the four binary members of the InGaAsP quaternary system range from 0.33 eV (InAs) to 2.25 eV (GaP), with InP (1.29 eV) and GaAs (1.43 eV) falling in between.

A semiconductor will only detect light with photon energy larger than the bandgap, or put another way, with a wavelength shorter than the cutoff wavelength associated with the bandgap. This "long wavelength cutoff" works out to 3.75 µm for InAs and 0.55 µm for GaP with InP at 0.96 µm and GaAs at 0.87 µm.

By mixing two or more of the binary compounds, the properties of the resulting ternary and quaternary semiconductors can be tuned to intermediate values. The challenge is that not only does the energy bandgap depend on the alloy composition, so also does the resulting lattice constant. For the four binary members of the InGaAsP quaternary system, the lattice constants range from 5.4505 Å (GaP) to 6.0585 Å (InAs) with GaAs at 5.6534 Å and InP at 5.8688 Å.

The InAs/GaAs alloy is referred to as InxGa1-xAs where x is the proportion of InAs and 1- x is the proportion of GaAs. One challenge is that while it is possible to make thin films of InxGa1-xAs by a number of techniques, a substrate is required to hold up the thin film. If the thin film and the substrate do not have the same lattice constant, then the properties of the thin film can be severely degraded.

Traditionally, the most convenient substrate for InxGa1-xAs is InP. High quality InP substrates are traditionally used with diameters as large as 100 mm. InxGa1—xAs with 53% InAs is often called "standard InGaAs" without bothering to note the values of "x" or "1–x" because it has the same lattice constant as InP and therefore the combination leads to very high quality thin films.

Standard InGaAs has a long wavelength cutoff of 1.68 µm. It is sensitive to the wavelengths of light that suffer the least signal dispersion and transmit furthest down a glass fiber (1.3 µm and 1.55 µm), and can detect "eye-safe" lasers (e.g., wavelengths longer than 1.4 µm). It is also considered the optimum wavelength band for detecting the natural glow of the night sky.

While standard InGaAs has a long wavelength cutoff of 1.68 µm, many applications require the detection of light with longer wavelengths. An important example is the ability to measure moisture content in agricultural products by measuring water absorption at 1.9 µm.

Another example is "LIDAR" (light detection and ranging), used in aircraft, for example, to detect clear air turbulence. LIDAR systems often use lasers that emit light with a wavelength of 2.05 µm. InxGa1-xAs with a longer cutoff is called "extended wavelength InGaAs."

Unfortunately, obtaining the longer cutoff is not as simple as adding more InAs to the alloy. Doing so would increase the lattice constant of the thin film, which causes a mismatch with the substrate, and this reduces the quality of the thin film. Considerable effort has been put into learning to grow high quality extended wavelength InGaAs.

Such methods and systems have generally been considered satisfactory for their intended purpose. However, there is still a need in the art for improved sensors. The present disclosure provides a solution for this need.

SUMMARY OF THE INVENTION

A sensor includes an InGaAs photodetector configured to convert received infrared radiation into electrical signals. A notch filter is operatively connected to the InGaAs photodetector to block detection of wavelengths within at least one predetermined band.

The InGaAs photodetector can be sensitive to at least one of SWIR or NIR radiation outside the at least one predetermined band. The notch filter can be configured to block detection of wavelengths within a predetermined band including 850 nm, 1060 nm, and/or 1550 nm. For example, the notch filter can be configured to block detection of wavelengths within each of three respective, non-overlapping bands, one band including 850 nm, one band including 1060 nm, and one band including 1550 nm.

The InGaAs photodetector can be configured to receive wavelengths up to and including approximately 1700 nm. A ROIC can be operatively connected to the InGaAs photodetector to condition electrical signals from the InGaAs photodetector. The InGaAs photodetector can include a two-dimensional array of photodetector pixels each configured to convert infrared radiation into electrical signals for imaging. A ROIC can operatively connected to the two-dimensional array of photodetector pixels to condition electrical signals from the two-dimensional array for imaging.

The notch filter can include an optical coating directly on a surface of the InGaAs photodetector. The optical coating can be monolithic with the InGaAs photodetector. It is also contemplated that the notch filter can be securely embedded in an optical path of the InGaAs photodetector, e.g., spaced apart from the InGaAs photodetector. A filter assembly, e.g., included in the notch filter or separate therefrom, can be optically coupled to the InGaAs photodetector to improve signal to noise ratio.

An imaging camera system includes an InGaAs photodetector configured to convert received infrared radiation into electrical signals, the InGaAs photodetector including an array, e.g., a one- or two-dimensional array, of photodetector pixels each configured to convert infrared radiation into electrical signals for imaging. At least one optical element is optically coupled to the InGaAs photodetector to focus an image on the array. A notch filter is operatively connected to the InGaAs photodetector to block detection of wavelengths within at least one predetermined band. A ROIC is operatively connected to the array to condition electrical signals from the array for imaging.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
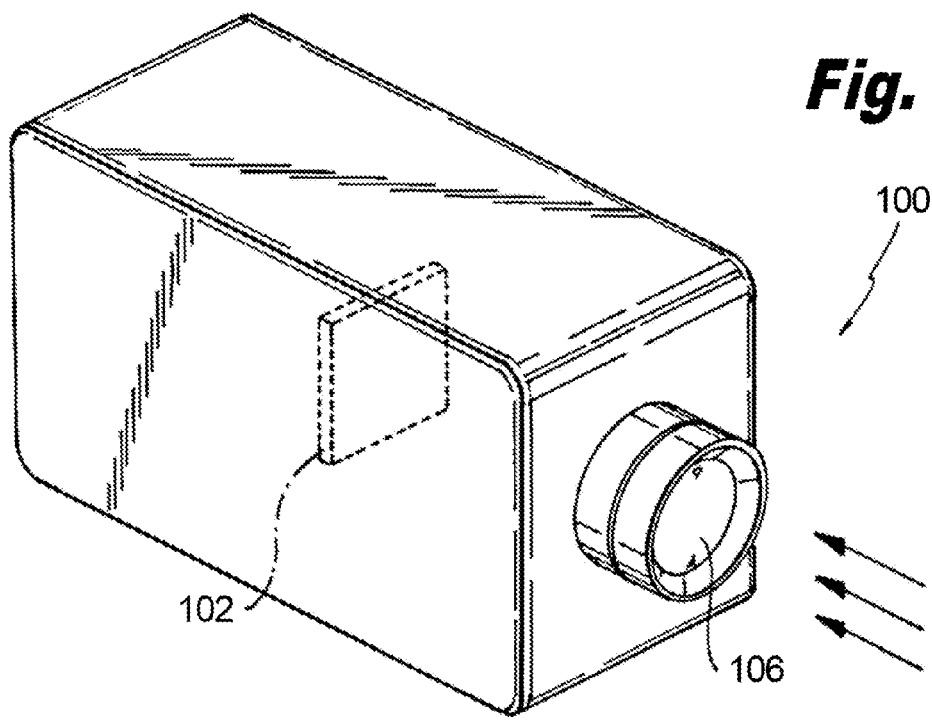
FIG. 1 is a schematic perspective view of an exemplary embodiment of an imaging camera system constructed in accordance with the present disclosure, showing an optical element for focusing an image on a sensor for imaging.

Reference will now be made to the drawings wherein like reference numerals identify similar structural features or aspects of the subject disclosure. For purposes of explanation and illustration, and not limitation, a partial view of an exemplary embodiment of an imaging camera system in accordance with the disclosure is shown in FIG. 1 and is designated generally by reference character 100. Other embodiments of sensors in accordance with the disclosure, or aspects thereof, are provided in FIGS. 2-3, as will be described. The systems and methods described herein can be used for infrared detection and imaging that excludes predetermined wavelengths.

Figure 2:
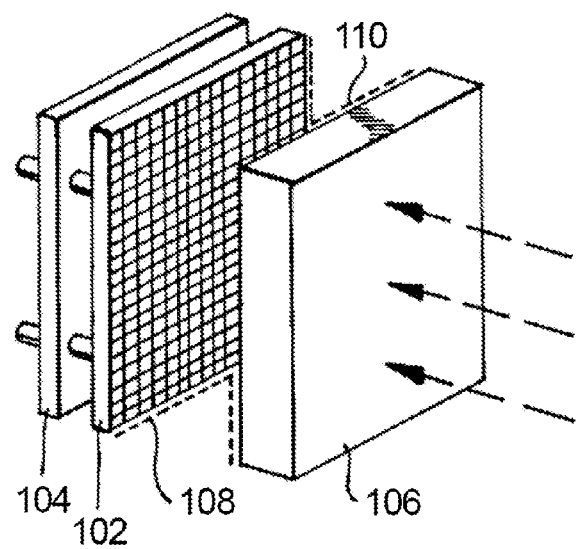
FIG. 2 is an exploded, schematic perspective view of a portion of the system of FIG. 1, showing the imaging sensor, optical elements, and filters.

An imaging camera system 100 includes a sensor 102 that includes an InGaAs photodetector configured to convert received infrared radiation, indicated by the triple arrows in FIGS. 1-2, into electrical signals. The InGaAs photodetector includes a two-dimensional array of photodetector pixels, indicated by the grid texture on sensor 102 in FIG. 2. Each pixel is configured to convert infrared radiation into electrical signals for imaging. At least one optical lens element 106 is optically coupled to the InGaAs photodetector to focus an image on the array, so the sensor 102 functions as a focal plane array (FPA), however embodiments including only a single photodetector, a one-dimensional array of photodetector pixels, or any other suitable configuration are all contemplated within the scope of this disclosure. A notch filter 108 is operatively connected to the InGaAs photodetector of sensor 102 to block detection of wavelengths within at least one predetermined band. A Read-Out Integrated Circuit (ROIC) 104 is operatively connected to the array of sensor 102 to condition electrical signals from the array for imaging.

The notch filter 108 includes an optical coating directly on a surface of the InGaAs photodetector of sensor 102, as indicated by the dashed lines in FIG. 8 associated with reference character 108. The optical coating can be monolithic with the InGaAs photodetector, and can be applied to the InGaAs detector by any suitable film deposition technique, e.g., for high volume commercial semiconductor processing. It is also contemplated in addition to or in lieu of notch filter 108, that the notch filter can be securely embedded in an optical path of the InGaAs photodetector, e.g., spaced apart from the InGaAs photodetector such as indicated in FIG. 2 with the broken line associated with reference character 110. A single notch filter can be used, or multiple notch filters, each for blocking a respective bandwidth or bandwidths, can be used at any suitable position in the optical path of system 100 leading to sensor 102. A filter assembly, e.g., included in the notch filter 108/110 or separate therefrom, can be optically coupled to the InGaAs photodetector to improve signal to noise ratio.

Figure 3:
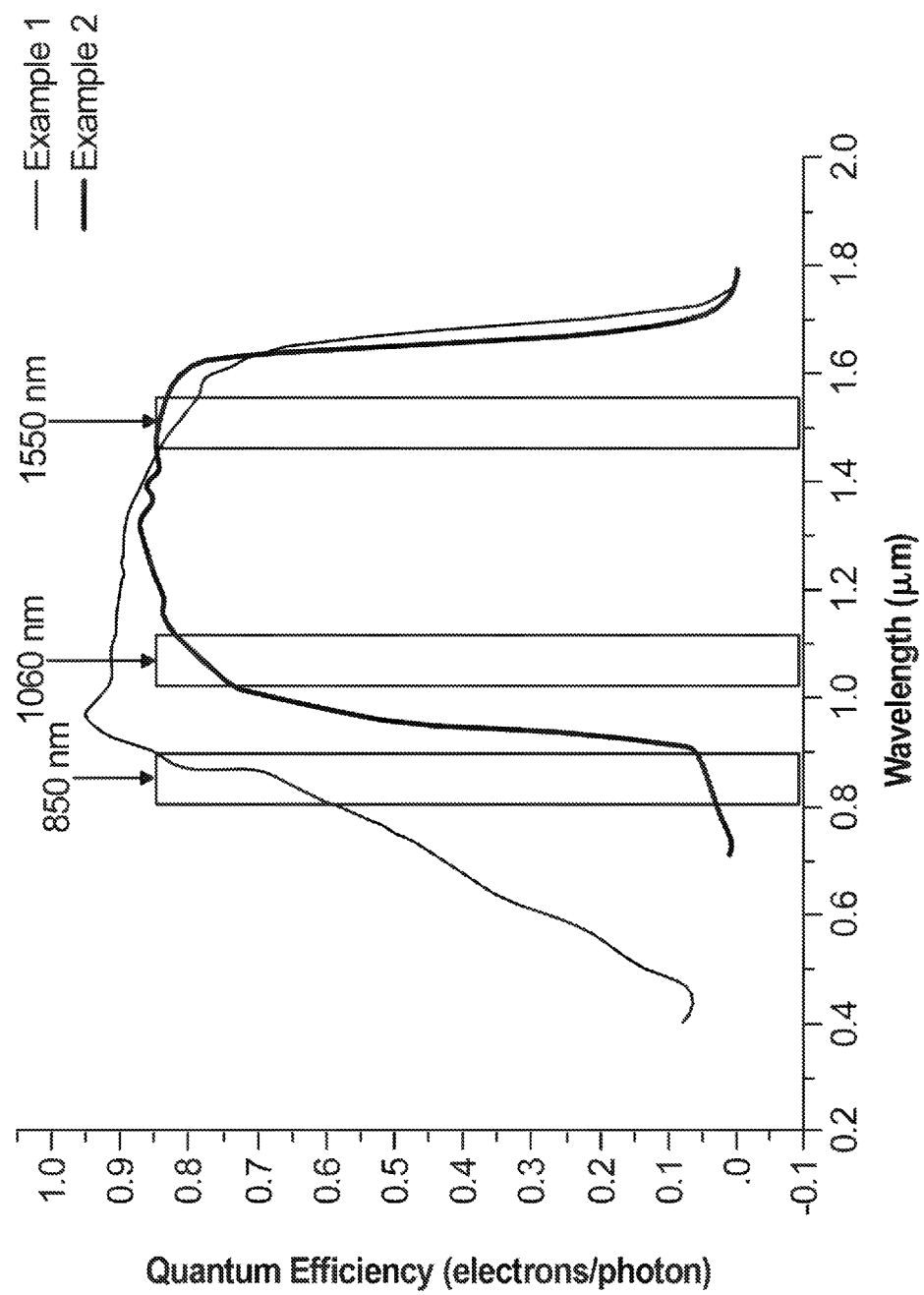
FIG. 3 is a graph showing quantum efficiency as a function of wavelength for two exemplary embodiments of sensors in accordance with the present disclosure, and showing exemplary predetermined bands for blocking detection of wavelengths by the sensor.

With reference now to FIG. 3, the InGaAs photodetector of sensor 102 can be configured to receive wavelengths up to and including 1700 nm. In FIG. 3, quantum efficiency curves are shown for two exemplary InGaAs photodetectors, each having a cutoff at or around 1700 nm. The sensor 102 for Example 1 has a higher quantum efficiency for visible light than the sensor 102 for Example 2, however in both examples the InGaAs photodetector is sensitive to at least one of SWIR (e.g. wavelengths from 1.4-3.0 μm) or NIR (e.g., wavelengths from 0.75-1.4 μm) radiation outside the at least one predetermined bands of notch filter 108/110. The notch filter 108/110 can be configured to block detection of wavelengths within predetermined bands including 850 nm, 1060 nm, and/or 1550 nm. The notch filter 108/110 for each of these two examples is configured to reflect or block detection of wavelengths within each of three respective, non-overlapping bands, one band including 850 nm ±20 nm, one band including 1060 nm±20 nm, and one band including 1550 nm±20 nm, as indicated in FIG. 3 by the rectangles. The 40 nm notch width in these examples can vary without departing from the scope of this disclosure, as can the centers of the notch bandwidth, as can the number of notches, as needed on an application by application basis. Eliminating detection of radiation in the notches of notch filter 108/110 allows for use in applications where it is desired to detect radiation across various portions of the spectrum of sensitivity for the InGaAs photodetector, wherein it is also desirable to prevent detection of radiation in the notch bands of notch filter 108/110, such as radiation from specific laser sources centered around the 860, 1060, and 1550 nm wavelengths. For example, there are applications which can benefit from ensuring that such laser sources do not interfere with the two-dimensional imagery obtained from an infrared sensor.

The methods and systems of the present disclosure, as described above and shown in the drawings, provide for sensors with superior properties including the ability to image while excluding certain predetermined wavelengths. While the apparatus and methods of the subject disclosure have been shown and described with reference to preferred embodiments, those skilled in the art will readily appreciate that changes and/or modifications may be made thereto without departing from the scope of the subject disclosure.

What is claimed is:
1. A sensor comprising:
an InGaAs photodetector configured to convert received infrared radiation into electrical signals; and
a notch filter operatively connected to the InGaAs photodetector, wherein the notch filter is configured to block detection of wavelengths within each of three respective, non-overlapping bands, one band including 850 nm, one band including 1060 nm, and one band including 1550 nm.

2. The sensor as recited in claim 1, wherein the InGaAs photodetector is sensitive to at least one of SWIR or NIR radiation outside the at least one predetermined band.

3. The sensor as recited in claim 1, further comprising a ROIC operatively connected to the InGaAs photodetector to condition electrical signals from the InGaAs photodetector.

4. The sensor as recited in claim 1, wherein the InGaAs photodetector is configured to receive wavelengths up to and including 1700 nm.

5. The sensor as recited in claim 1, further comprising a filter assembly optically coupled to the InGaAs photodetector to improve signal to noise ratio.

6. The sensor as recited in claim 1, wherein the notch filter includes an optical coating directly on a surface of the InGaAs photodetector.

7. The sensor as recited in claim 5, wherein the optical coating is monolithic with the InGaAs photodetector.

8. The sensor as recited in claim 1, wherein the notch filter is securely embedded in an optical path of the InGaAs photodetector.

9. The sensor as recited in claim 1, wherein the InGaAs photodetector includes a two-dimensional array of photodetector pixels each configured to convert infrared radiation into electrical signals for imaging.

10. The sensor as recited in claim 9, further comprising a ROIC operatively connected to the two-dimensional array of photodetector pixels to condition electrical signals from the two-dimensional array for imaging.

11. An imaging camera system comprising:
an InGaAs photodetector configured to convert received infrared radiation into electrical signals, the InGaAs photodetector including an array of photodetector pixels each configured to convert infrared radiation into electrical signals for imaging;
at least one optical element optically coupled to the InGaAs photodetector to focus an image on the array;
a notch filter operatively connected to the InGaAs photodetector, wherein the notch filter is configured to block detection of wavelengths within each of three respective, non-overlapping bands, one band including 850 nm, one band including 1060 nm, and one band including 1550 nm; and
a ROIC operatively connected to the array to condition electrical signals from the array for imaging.

* * * * *